US011522075B2

(12) United States Patent
Oshino

(10) Patent No.: US 11,522,075 B2
(45) Date of Patent: Dec. 6, 2022

(54) SEMICONDUCTOR DEVICE AND METHOD OF MANUFACTURING SAME

(71) Applicant: SANKEN ELECTRIC CO., LTD., Niiza (JP)

(72) Inventor: Yuuichi Oshino, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 0 days.

(21) Appl. No.: 17/160,744

(22) Filed: Jan. 28, 2021

(65) Prior Publication Data
US 2021/0151590 A1 May 20, 2021

Related U.S. Application Data

(63) Continuation of application No. PCT/JP2018/037777, filed on Oct. 10, 2018.

(51) Int. Cl.
*H01L 29/739* (2006.01)
*H01L 21/225* (2006.01)
(Continued)

(52) U.S. Cl.
CPC ........ *H01L 29/7397* (2013.01); *H01L 21/225* (2013.01); *H01L 29/0804* (2013.01); *H01L 29/66348* (2013.01)

(58) Field of Classification Search
CPC ............... H01L 29/7397; H01L 21/225; H01L 29/0804; H01L 29/66348; H01L 21/2253;
(Continued)

(56) References Cited

U.S. PATENT DOCUMENTS

2018/0069075 A1\* 3/2018 Naito .................... H01L 29/063
2019/0109218 A1\* 4/2019 Corvasce .............. H01L 29/402
(Continued)

FOREIGN PATENT DOCUMENTS

JP    H08-316479 A    11/1996
JP    2001-250947 A    9/2001
(Continued)

OTHER PUBLICATIONS

International Search Report of PCT/JP2018/037777 dated Jan. 15, 2019.

*Primary Examiner* — Shahed Ahmed
(74) *Attorney, Agent, or Firm* — Metrolex IP Law Group, PLLC

(57) ABSTRACT

A semiconductor device according to one or more embodiments may include a first semiconductor region of a first conductivity type, a second semiconductor region of the first conductivity type with a higher impurity concentration than an impurity concentration of the first semiconductor region, the second semiconductor region being provided on a first principal surface of the first semiconductor region, a third semiconductor region of a second conductivity type provided on an upper surface of the second semiconductor region, the third semiconductor region being doped with an impurity in accordance with an impurity concentration profile including peaks along a film thickness direction, a fourth semiconductor region of the first conductivity type provided on an upper surface of the third semiconductor region.

4 Claims, 6 Drawing Sheets

(51) Int. Cl.
*H01L 29/08* (2006.01)
*H01L 29/66* (2006.01)

(58) Field of Classification Search
CPC ... H01L 29/36; H01L 29/66325–66348; H01L 29/7393–7398; H01L 29/083–0839; H01L 29/66613–66628; H01L 29/7813; H01L 29/7825; H01L 29/42336
See application file for complete search history.

(56) References Cited

U.S. PATENT DOCUMENTS

| | | | |
|---|---|---|---|
| 2019/0221642 A1* | 7/2019 | Naito | H01L 29/407 |
| 2019/0312101 A1* | 10/2019 | Sakurai | H01L 29/1095 |
| 2020/0058506 A1* | 2/2020 | Nakamura | H01L 21/26506 |

FOREIGN PATENT DOCUMENTS

| | | | | |
|---|---|---|---|---|
| JP | 2012-253276 A | 12/2012 | | |
| JP | 2016-034001 A | 3/2016 | | |
| JP | 2018-041845 A | 3/2018 | | |
| WO | 2012/164817 A1 | 12/2012 | | |
| WO | WO-2016017273 A1 * | 2/2016 | | H01L 29/739 |

* cited by examiner

SEMICONDUCTOR DEVICE AND METHOD OF MANUFACTURING SAME

CROSS REFERENCE TO RELATED APPLICATIONS

This application is a continuation application of International Application No. PCT/JP2018/037777, filed on Oct. 10, 2018, the entire contents of which are incorporated herein by reference.

BACKGROUND

This disclosure relates to a semiconductor device which includes a carrier accumulation layer located adjacent to a base region.

An insulated gate bipolar transistor (IGBT) having high input impedance and low on-resistance has been used as a switching element (a power semiconductor element) that performs a large-current switching operation. For example, the IGBT has been used in a motor drive circuit and the like.

A structure in which a carrier accumulation layer having a higher impurity concentration than that of a drift region is arranged between a base region and the drift region is applicable to the IGBT (see Japanese Patent Application Publication No. Hei 8-316479 (Patent Document 1)). Patent Document 1 discloses a device in which holes are accumulated in the drift region whereby the holes are kept from moving from a collector region and reaching an emitter region. In this context, Patent Document 1 discloses that on-resistance of a semiconductor device can be suppressed accordingly.

However, this device has a problem that the impurity in the carrier accumulation layer is also diffused during formation of the base region after forming the carrier accumulation layer. In this case, the impurity concentration of the carrier accumulation layer is reduced. As a consequence, the reduction in on-resistance is inhibited due to a failure to sufficiently increase an amount of accumulation of the holes in the drift region.

SUMMARY

A method of manufacturing a semiconductor device according to one or more embodiments may include: doping an impurity from one principal surface of a first semiconductor region of a first conductivity type and forming a second semiconductor region of the first conductivity type with a higher impurity concentration than an impurity concentration of the first semiconductor region; forming a third semiconductor region of a second conductivity type on the second semiconductor region, the third semiconductor region being provided with an impurity concentration profile along a film thickness direction which includes peaks; forming a fourth semiconductor region of the first conductivity type on an upper surface of the third semiconductor region; forming a gate insulating film on an inner wall of a groove that extends from the fourth semiconductor region and penetrates the third semiconductor region; forming a control electrode inside the groove in such a way as to be opposed to a side surface of the third semiconductor region through the gate insulating film; forming a fifth semiconductor region of the first conductivity type with a higher impurity concentration than the impurity concentration of the first semiconductor region on another principal surface of the first semiconductor region; and forming a sixth semiconductor region of the second conductivity type on the other principal surface of the first semiconductor region through the fifth semiconductor region. The forming a third semiconductor region may include doping an impurity of the second conductivity type two or more times into different depths of the first semiconductor region.

A semiconductor device according to one or more embodiments may include: a first semiconductor region of a first conductivity type; a second semiconductor region of the first conductivity type with a higher impurity concentration than an impurity concentration of the first semiconductor region, the second semiconductor region being provided on a first principal surface of the first semiconductor region; a third semiconductor region of a second conductivity type provided on an upper surface of the second semiconductor region, the third semiconductor region being doped with an impurity in accordance with an impurity concentration profile including peaks along a film thickness direction; a fourth semiconductor region of the first conductivity type provided on an upper surface of the third semiconductor region; a gate insulating film provided on an inner wall of a groove that extends from an upper surface of the fourth semiconductor region and penetrates the third semiconductor region; a control electrode provided inside the groove in such a way as to be opposed to a side surface of the third semiconductor region through the gate insulating film; a fifth semiconductor region of the first conductivity type with a higher impurity concentration than the impurity concentration of the first semiconductor region, the fifth semiconductor region being provided on a second principal surface of the first semiconductor region opposed to the first principal surface; and a sixth semiconductor region of the second conductivity type provided on the second principal surface of the first semiconductor region through the fifth semiconductor region.

DETAILED DESCRIPTION

Figure 1:
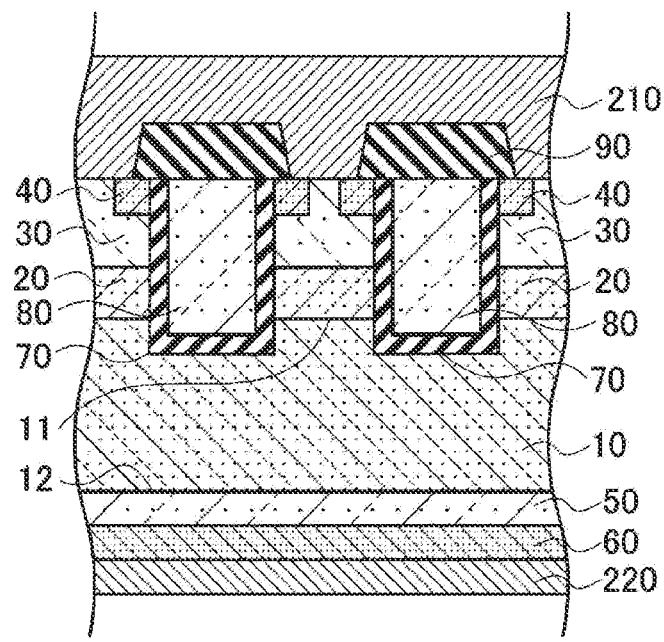
FIG. 1 is a diagram illustrating a schematic cross-sectional view of a semiconductor device according to one or more embodiments.

One or more embodiments are described with reference to the drawings. In the following description of the drawing, identical or similar constituents are denoted by identical or similar reference signs. It is to be noted, however, that the drawings are merely schematic and relations of thicknesses and planar dimensions, length ratios of respective components, and the Ike are different from reality. Therefore, specific dimensions should be determined in consideration of the following description. In the meantime, it is needless to say that dimensional relations and ratios may also be different among the drawings.

It is to be also understood that the embodiments described below are mere examples of a device and a method to realize the technical idea of this invention and that the technical idea of this invention is not intended to limit shapes, structures, layouts and the like of the constituents to the configurations described below.

As illustrated in FIG. 1, in a semiconductor device according one or more embodiments, on a first principal surface 11 of a first semiconductor region (a drift region 10) of a first conductivity type, there is arranged a second semiconductor region (a carrier accumulation layer 20) of the first conductivity type having a higher impurity concentration than that of the first semiconductor region. A third semiconductor region (a base region 30) of a second conductivity type is arranged on the second semiconductor region, and a fourth semiconductor region (an emitter region 40) of the first conductivity type is arranged on an upper surface of the third semiconductor region. An impurity is doped in the base region 30 in accordance with an impurity concentration profile that has two or more peaks along a film thickness direction.

The semiconductor device illustrated in FIG. 1 may be an IGBT of a trench gate type. The semiconductor device illustrated in FIG. 1 is provided with a groove that extends from an upper surface of the emitter region 40 and penetrates the emitter region 40, the base region 30, and the carrier accumulation layer 20. Moreover, a gate insulating film 70 is arranged on an inner wall of the groove. A control electrode (a gate electrode 80) is arranged inside the groove in such a way as to be opposed to a side surface of the base region 30 through the gate insulating film 70. A surface of the base region 30 opposed to the gate electrode 80 through the gate insulating film 70 serves as a channel region where a channel is formed. In the embodiment illustrated in FIG. 1, a tip of the groove that penetrates the carrier accumulation layer 20 reaches the drift region 10.

The first conductivity type and the second conductivity type are mutually opposite conductivity types. Specifically, when the first conductivity type is an n-type, the second conductivity type is a p-type. When the first conductivity type is the p-type, the second conductivity type is the n-type.

An example described below assumes a case where the first conductivity type is the n-type and the second conductivity type is the p-type.

On a second principal surface 12 of the drift region 10 opposed to the first principal surface 11, there is arranged a fifth semiconductor region (a field stop region 50) of the first conductivity type having a higher impurity concentration than that of the drift region 10. Moreover, a sixth semiconductor region (a collector region 60) of the second conductivity type is arranged on the second principal surface 12 of the drift region 10 through the field stop region 50. The field stop region 50 keeps a depletion layer, which extends from a lower surface of the base region 30 in an off-state, from reaching the collector region 60. On one principal surface of the collector region 60 opposed to the other principal surface coupled to the field stop region 50, there is arranged a collector electrode 220 that is electrically coupled to the collector region 60.

An emitter electrode 210, which is electrically coupled to the base region 30 and to the emitter region 40 selectively arranged on an upper surface of the base region 30, is arranged above the gate electrode 80. The emitter electrode 210 is arranged above an interlayer insulating film 90 and the emitter electrode 210 is coupled to the base region 30 and to the emitter region 40 through an opening provided in the interlayer insulating film 90. The interlayer insulating film 90 electrically insulates the gate electrode 80 from the emitter electrode 210.

Now, a description is given of an operation of the semiconductor device illustrated in FIG. 1. A prescribed collector voltage is applied between the emitter electrode 210 and the collector electrode 220 while a prescribed gate voltage is applied between the emitter electrode 210 and the gate electrode 80. For example, the collector voltage is set in a range from about 300 V to 1600 V and the gate voltage is set in a range from about 10 V to 20 V. When the semiconductor device is set to an on-state as described above, the channel region is inverted from the p-type to the n-type whereby a channel is generated. Electrons are injected from the emitter electrode 210 to the drift region 10 through the generated channel. In the meantime, a route from the collector region 60 to the drift region 10 is forward-biased whereby holes migrate from the collector electrode 220 through the collector region 60 and then to the drift region 10, the carrier accumulation layer 20, and the base region 30 in this order. As an electric current is further increased, the holes from the collector region 60 are increased and the holes are accumulated in the drift region 10. As a consequence, on-resistance is reduced due to conductivity modulation.

In the case of changing the semiconductor device from the on-state to an off-state, the gate voltage is controlled below a threshold voltage. For example, the gate voltage is set to an electric potential equal to an emitter voltage or to a negative electric potential. Thus, the channel in the base region 30 disappears and the injection of the electrons from the emitter electrode 210 to the drift region 10 is discontinued. Since the electric potential of the collector electrode 220 is higher than that of the emitter electrode 210, the depletion layer spreads from an interface between the base region 30 and the carrier accumulation layer 20 and the holes accumulated in the drift region 10 are withdrawn to the emitter electrode 210. In this instance, the holes migrate while passing through a semiconductor region located between two grooves. In other words, the region between the grooves serves as a withdrawal port for the holes.

In the semiconductor device illustrated in FIG. 1, an electric field directed from the carrier accumulation layer 20 to the drift region 10 in the on-state is generated by arranging the carrier accumulation layer 20 having the higher impurity concentration than that of the drift region 10 between the drift region 10 and the base region 30. Accordingly, the holes are accumulated at a portion of the drift region 10 in the vicinity of an interface between the drift region 10 and the carrier accumulation layer 20. For this reason, more holes are accumulated as compared to the case of not providing the carrier accumulation layer 20. As a consequence, it is possible to further reduce the on-resistance of the semiconductor device.

Here, it the impurity concentration of the carrier accumulation layer 20 is set too high, the depletion layer generated by p-n junction of the interface between the base region 30 and the carrier accumulation layer 20 in the off-state is kept from spreading. As a consequence, a dielectric withstanding voltage of the semiconductor device is reduced. It is therefore preferable to set the impurity concentration of the carrier accumulation layer 20 higher than the impurity concentration of the drift region 10 and lower than the impurity concentration of the base region 30.

Incidentally, if the impurity concentration of the carrier accumulation layer 20 is reduced, an amount of accumulation of the holes in the drift region 10 is not sufficiently increased whereby the reduction in on-resistance is suppressed. Specifically, if a heating process (hereinafter referred to as "base annealing") for diffusing an impurity doped in the base region 30 is carried out after formation of the carrier accumulation layer 20, an impurity in the carrier accumulation layer 20 is diffused more as time of the base annealing is longer. Hence, the impurity concentration of the carrier accumulation layer 20 is reduced. For example, in the case of forming the base region 30 by doping the impurity from a semiconductor surface side and diffusing the impurity after forming the carrier accumulation layer 20 by doping the impurity from the semiconductor surface side and diffusing the impurity, the impurity diffused in the carrier accumulation layer 20 and the impurity in the base region 30 annihilate with each other and the impurity concentration of the carrier accumulation layer 20 is reduced as a consequence.

On the other hand, in the semiconductor device of the embodiment, the base region 30 is formed by doping the impurity of the second conductivity type two or more times into different depths. Accordingly, the semiconductor device of the embodiment may achieve the diffusion required for obtaining the base region 30 in such a film thickness along the groove that forms a predetermined length of the channel region in a short period of time. In other words, as compared to the case of forming the base region 30 by doping the impurity just once, the semiconductor device according to one or more embodiments may be formed by requiring shorter base annealing time. As a consequence, according to the semiconductor device illustrated in FIG. 1, the diffusion of the impurity in the carrier accumulation layer 20 is suppressed whereby the on-resistance can be reduced. Moreover, as a consequence of doping the impurity several times into different depths, an impurity concentration profile of the base region 30 has two or more peaks in the film thickness direction.

For example, the base annealing time for forming the base region 30 in the film thickness of about 2.5 μm requires 2 to 3 hours in the case of doping the impurity just once. On the other hand, the base annealing time accounts for several tens of seconds in the case of doping the impurity twice into different depths. Accordingly, the semiconductor device of the embodiment can suppress the reduction in impurity concentration of the carrier accumulation layer 20 attributed to the base annealing.

Figure 2:
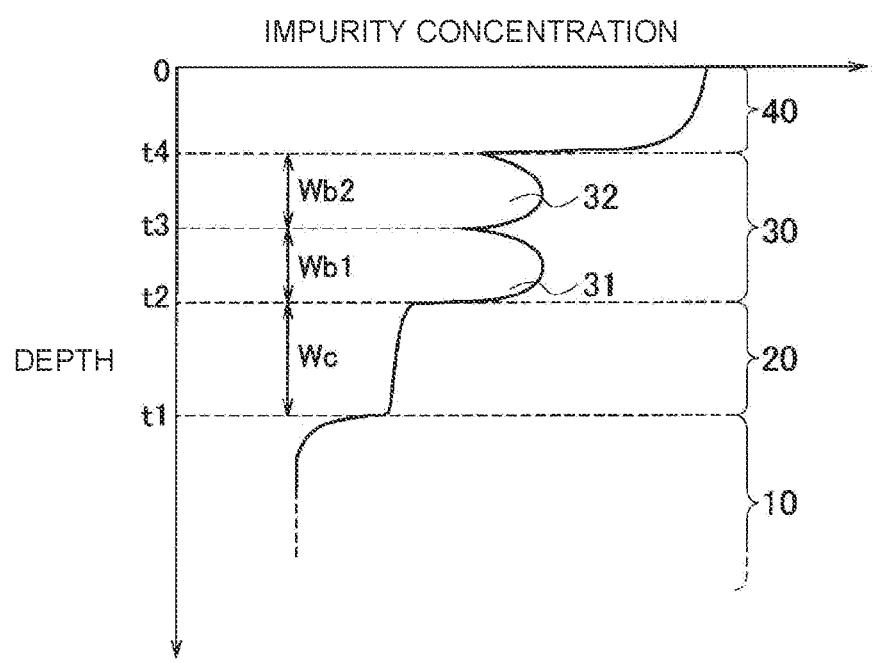
FIG. 2 is a diagram illustrating an example of an impurity concentration profile of the semiconductor device according to the one or more embodiments.

FIG. 2 is a diagram illustrating an example of the impurity concentration profile of the semiconductor device, such as depicted in FIG. 1. FIG. 2 illustrates the example of forming the base region 30 by doping the impurity twice. A horizontal axis of the impurity concentration profile indicates the impurity concentration while a vertical axis thereof indicates a depth in the film thickness direction while defining the upper surface of the emitter region 40 as a reference position 0.

In the impurity concentration profile illustrated in FIG. 2, a depth t1 represents a position of a boundary between the drift region 10 and the carrier accumulation layer 20 while a depth t2 represents a position of a boundary between the carrier accumulation layer 20 and the base region 30. A depth t3 represents a position of a boundary between a first base region 31 in which the impurity doped in a first session for forming the base region 30 is diffused and a second base region 32 in which the impurity doped in a second session is diffused. A depth t4 represents a position of a boundary between the base region 30 and the emitter region 40. For example, a film thickness of the carrier accumulation layer 20 is around 1 μm, and a film thickness of the base region 30 is around 2.5 μm, and a film thickness of the emitter region 40 is around 0.5 μm. In this instance, the depth t1 is about 4 μm, the depth t2 is about 3 μm, and the depth t4 is about 0.5 μm. The depth t3 is about in the middle of the depth t2 and the depth t4.

In the following, a region from a certain minimum value on the impurity concentration profile of the base region 30 to an adjacent minimum value across one peak thereon is defined as a "convex region" of the impurity concentration. In other words, each of the first base region 31 and the second base region 32 is formed of one convex region. The convex region of the first base region 31 corresponds to a range from the boundary between the carrier accumulation layer 20 and the base region 30 to the boundary between the first base region 31 and the second base region 32. The convex region of the second base region 32 corresponds to a range from the boundary between the first base region 31 and the second base region 32 to the boundary between the base region 30 and the emitter region 40.

The smaller the width in the film thickness direction of the convex region is, the shorter the time of the base annealing is for forming the base region 30 by diffusion of the impurity. For example, the width in the film thickness direction of each convex region included in the impurity concentration profile of the base region 30 is set smaller than the film thickness of the carrier accumulation layer 20 along the groove.

In the meantime, the film thickness of the base region 30 equivalent to a sum of a film thickness Wb1 of the first base region 31 and a film thickness Wb2 of the second base region 32 can be set larger than a film thickness Wc of the carrier accumulation layer 20, for example. The above-described example explains the case where the number of times of doping the impurity for forming the base region 30 is twice, Instead, the number of times of doping the impurity may be three times or more. As a consequence, according to the semiconductor device of the embodiment, the film thickness of the base region 30 can be set without any concern for the reduction in impurity concentration of the carrier accumulation layer 20 attributed to the base annealing. Meanwhile, the film thickness of the base region 30 affects a threshold value or a short circuit capacity of the semiconductor device. According to the semiconductor device of the embodiment, it is possible to enhance design margins in light of these values.

Here, the diffusion of the impurity in the carrier accumulation layer 20 is suppressed by reducing the base annealing time. This makes it possible to realize the semiconductor device having a small film thickness of the carrier accumulation layer 20. For example, the film thickness of the carrier accumulation layer 20 along the groove can be set below 1 μm. Thus, it is possible to spread the depletion layer more favorably to the drift region 10 side and to suppress electric field concentration at a bottom portion of the groove and the like.

As described above, according to the semiconductor device of the embodiment, the reduction in impurity concentration of the carrier accumulation layer 20 is suppressed so that the on-resistance of the semiconductor device can be reduced.

A method of manufacturing the semiconductor device illustrated in FIG. 1 is described below with reference to the drawings. Note that the manufacturing method described below is a mere example. Of course, it is possible to realize the semiconductor device illustrated in FIG. 1 in accordance with various other manufacturing methods inclusive of the following modified example.

Figure 3:
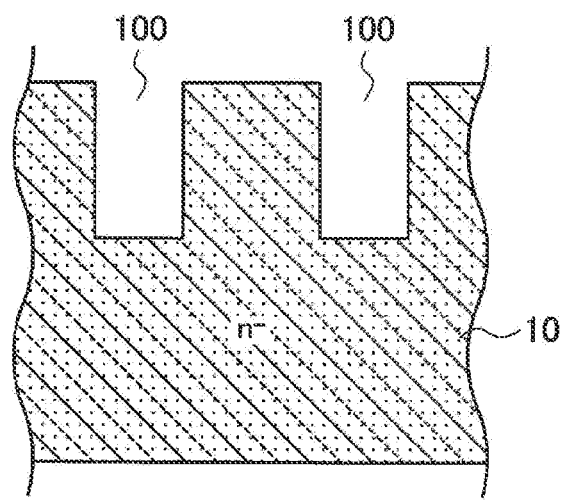
FIG. 3 is a diagram illustrating a first schematic cross-sectional view of a process for describing a method of manufacturing the semiconductor device according to the one or more embodiments.

As illustrated in FIG. 3, grooves 100 extending in the film thickness direction are formed in regions of the drift region 10 of an n-type being silicon semiconductor, for example, the regions being supposed to arrange the gate electrodes 80 therein. The grooves 100 are formed by using photolithographic techniques and etching techniques, for example.

Figure 4:
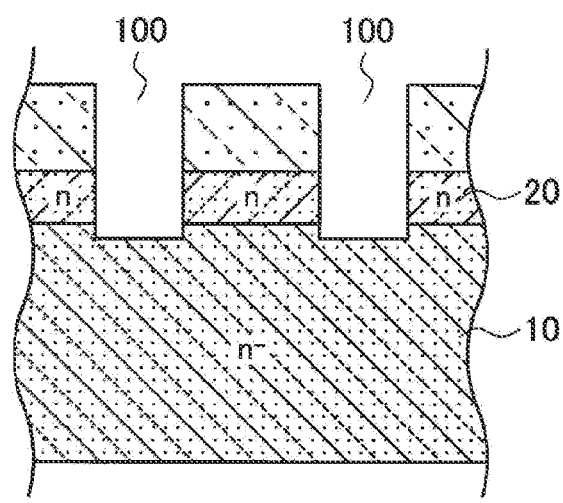
FIG. 4 is a diagram illustrating a second schematic cross-sectional view of the process for describing the method of manufacturing the semiconductor device according to the one or more embodiments.

Then, an n-type impurity is doped into a prescribed depth from a surface of the drift region 10, thereby forming the carrier accumulation layer 20 of the n-type at a higher concentration than that of the drift region 10 as illustrated in FIG. 4. For example, the impurity concentration of the drift region 10 is in a range from about $1E13$ $cm^{-3}$ to $1$ $E14$ $cm^{-3}$ while an impurity peak concentration of the carrier accumulation layer 20 is in a range from about $8E14$ $cm^{-3}$ to $5E15$ $cm^{-3}$. Examples of the n-type impurity include phosphorus (P), Arsenic (As), and the like. Here, the carrier accumulation layer 20 is formed such that the bottom surface of the carrier accumulation layer 20 is located above the bottom portion of each groove 100.

Figure 5:
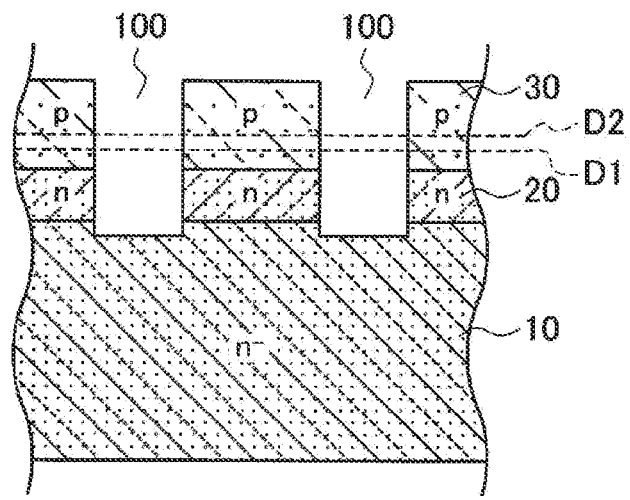
FIG. 5 is a diagram illustrating a third schematic cross-sectional view of the process for describing the method of manufacturing the semiconductor device according to the one or more embodiments.

Thereafter, the p-type base region 30 is formed on the carrier accumulation layer 20 by doping the impurity in such a way that the impurity concentration profile along the film thickness direction has two or more peaks. Here, the impurity concentration profile having two or more peaks along the film thickness direction can be easily obtained by doping the p-type impurity two or more times into different depths. For example, as illustrated in FIG. 5, the p-type impurity is doped into a first doping position D1 and a second doping position D2 that is closer to the surface than the first doping position D1 is. The first doping position D1 is a position of the peak of the impurity concentration in the first base region 31 illustrated in FIG. 2. The second doping position D2 is a position of the peak of the impurity concentration in the second base region 32 illustrated in FIG. 2. The depths of doping the impurity are set by adjusting magnitude of energy used for doping the impurity in accordance with an ion implantation method, for example. For instance, a peak value of the impurity concentration in the base region 30 is in a range from about $5E16$ $cm^{-3}$ to $5E17$ $cm^{-3}$. Examples of the p-type impurity include boron (B) and the like.

Figure 6:
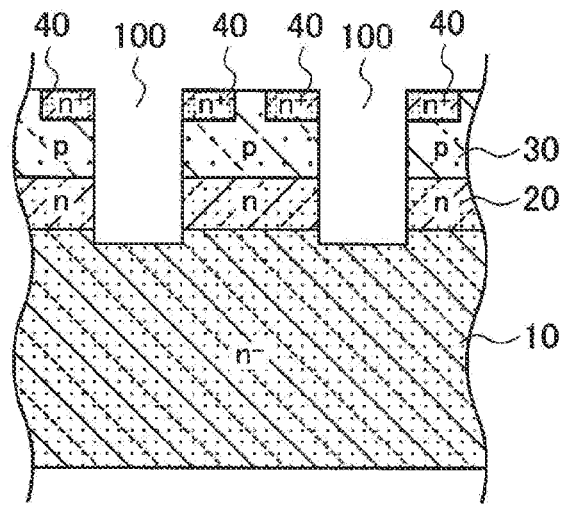
FIG. 6 is a diagram illustrating a fourth schematic cross-sectional view of the process for describing the method of manufacturing the semiconductor device according to the one or more embodiments.
Figure 7:
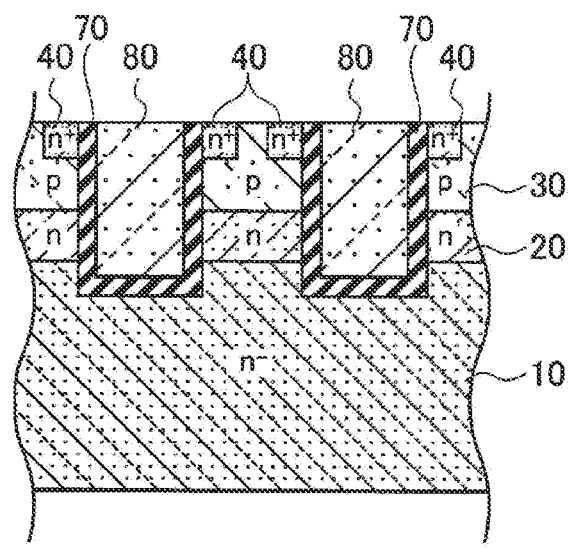
FIG. 7 is a diagram illustrating a fifth schematic cross-sectional view of the process for describing the method of manufacturing the semiconductor device according to the one or more embodiments.

Next, as illustrated in FIG. 6, the $n^+$-type emitter region 40 is selectively formed by doping the n-type impurity into the upper surface of the base region 30. The impurity concentration of the emitter region 40 is about $1E20$ $cm^{-3}$, for example. Meanwhile, the gate insulating film 70 is formed on the inner wall of each groove 100. For example, a silicon oxide ($SiO_2$) film having a film thickness in a range from about 100 nm to 300 nm is formed as the gate insulating film 70 in accordance with a thermal oxidation method. After the formation of the gate insulating films 70, the gate electrodes 80 are formed on the respective gate insulating films 70 in such a way as to fill the inside of the grooves 100 as illustrated in FIG. 7. For example, a polycrystalline silicon film or the like is used for each gate electrode 80.

Figure 8:
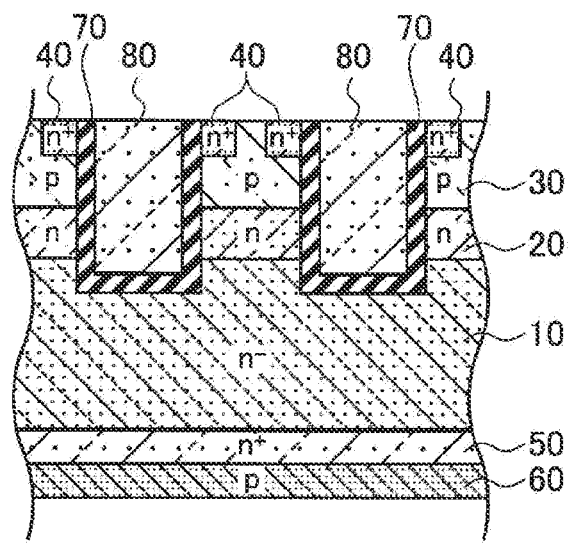
FIG. 8 is a diagram illustrating a sixth schematic cross-sectional view of the process for describing the method of manufacturing the semiconductor device according to the one or more embodiments.

Subsequently, the n-type impurity and the p-type impurity are doped into prescribed depths, respectively, from a rear surface of the drift region 10, thereby forming the field stop region 50 and the collector region 60 as illustrated in FIG. 8. An impurity peak concentration of the field stop region 50 is in a range from about $1E16$ $cm^{-3}$ to $1E17$ $cm^3$, and an impurity peak concentration of the collector region 60 is in a range from about $1E17$ $cm^{-3}$ to $1E18$ $cm^{-3}$.

The interlayer insulating film 90 is formed so as to cover upper surfaces of the emitter region 40, the base region 30, and the gate electrodes 80. Then, the emitter electrode 210 to be coupled to the emitter region 40 and the base region 30 is formed on the interlayer insulating film 90. For example, an opening is provided at a portion of the interlayer insulating film 90 so as to expose the surfaces of the emitter region 40 and the base region 30, and then the emitter electrode 210 is formed in such a way as to bury this opening. In the meantime, the collector electrode 220 is formed on a rear surface of the collector region 60. Thus, the semiconductor device illustrated in FIG. 1 is finished.

The carder accumulation layer 20, the base region 30, and the emitter region 40 are formed in accordance with an impurity diffusion method designed to dope an impurity and then to diffuse the impurity by conducting the heating process. In this instance, a diffusion process of the n-type impurity doped in the carrier accumulation layer 20, a diffusion process of the p-type impurity doped in the base region 30, and a diffusion process of the n-type impurity doped in the emitter region 40 may be carried out by performing heating processes separately after the doping processes of the respective regions. Alternatively, the diffusion of the impurities in the carrier accumulation layer 20, the base region 30, and the emitter region 40 may be carried out simultaneously in a single session of the heating process instead of carrying out the separate heating processes for diffusing the impurities in the respective regions.

Meanwhile, the above-described method is designed to form the carrier accumulation layer 20, the base region 30, and the emitter region 40 after the formation of the grooves 100. Instead, the grooves 100 may be formed after the formation of the carrier accumulation layer 20, the base region 30, and the emitter region 40. Alternatively, the grooves 100 and the emitter region 40 may be formed after the formation of the carrier accumulation layer 20 and the base region 30.

According to the method of manufacturing the semiconductor device described above, the base region 30 is formed by doping the impurity two or more times into different depths. For this reason, as compared to the case of doping the impurity once, the method of manufacturing the semiconductor device according to the embodiment can reduce a range of diffusion of the impurity in the base region 30 by the base annealing. Thus, it is possible to suppress the diffusion in impurity concentration of the carrier accumulation layer 20 attributed to the base annealing by reducing the base annealing time. As a consequence, the reduction in impurity concentration of the carrier accumulation layer 20 is suppressed in the manufacturing process so that the on-resistance of the semiconductor device can be reduced.

The base annealing time becomes shorter as the width in the film thickness direction of the convex region is smaller. For this reason, an interval of depths to dope the p-type impurity in the base region 30 may be set smaller than the film thickness of the carrier accumulation layer 20 along the groove. Accordingly, the width in the film thickness direction of each of the convex regions included in the impurity concentration profile of the base region 30 becomes smaller than the film thickness of the carrier accumulation layer 20 along the groove.

In the meantime, according to the method of manufacturing the semiconductor device of the embodiment, the reduction in impurity concentration of the carrier accumulation layer 20 attributed to the base annealing is suppressed even when the film thickness of the base region 30 is increased. As a consequence, it is possible to form the film thickness of the base region 30 larger than the film thickness of the carrier accumulation layer 20.

Meanwhile, the film thickness of the base region 30 affects the threshold value or the short circuit capacity of the semiconductor device. According to the semiconductor device of the embodiment, it is possible to increase the impurity concentration of the carrier accumulation layer 20 easily without reducing the film thickness of the base region 30.

Here, an interval between the depths to dope the impurity can be reduced by increasing the number of times of doping the impurity. Accordingly, the base annealing time can be reduced even in the case of increasing the film thickness of the base region 30, for example. As a consequence, the reduction in impurity concentration of the carrier accumulation layer 20 is suppressed so that the on-resistance of the semiconductor device can be reduced.

In the case of forming the base region 30 by doping the impurity into several depths, it is possible to adjust the impurity concentration of the base region 30 that affects the threshold value or the short circuit capacity of the IGBT or causes latch-up. This makes it possible to enhance design margins of the base region 30. For example, the short circuit capacity or the latch-up can be suppressed by setting the higher impurity concentration of the base region 30. On the other hand, the on-resistance is increased by setting the higher impurity concentration of the base region 30. Accordingly, the impurity concentration profile of the base region 30 is to be set in conformity to characteristics required from the semiconductor device.

Modified Example

FIG. 2 illustrates the example of the impurity concentration profile in which the peak values of the impurity concentration in the two convex regions have substantially the same magnitude. Instead, in the impurity concentration profile of the base region 30, the impurity concentration at a peak close to the carrier accumulation layer 20 may be set higher than the impurity concentration at a peak close to the emitter region 40 as illustrated in FIG. 9.

Figure 9:
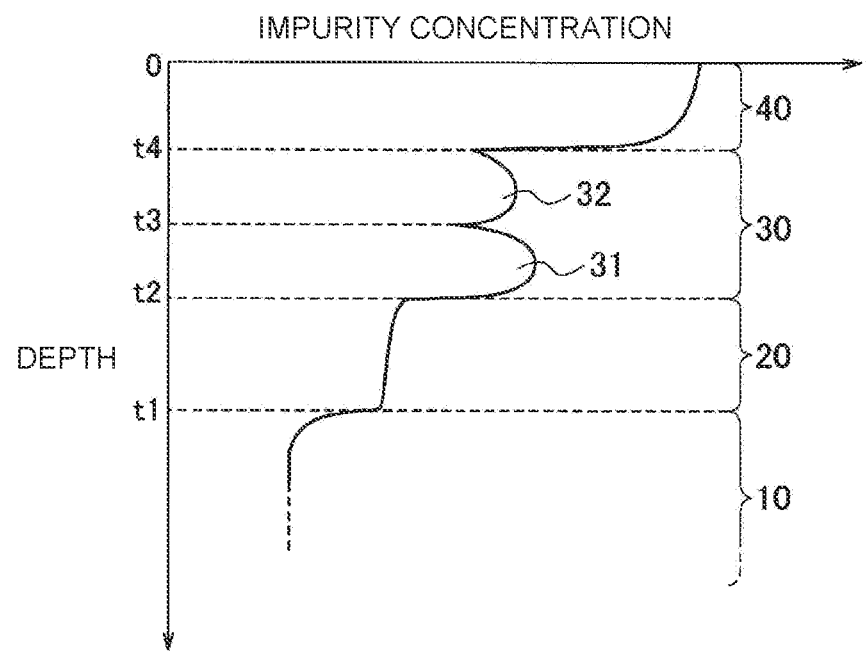
FIG. 9 is a diagram illustrating an example of an impurity concentration profile of a semiconductor device according to a modified example of the one or more embodiments.
Figure 10:
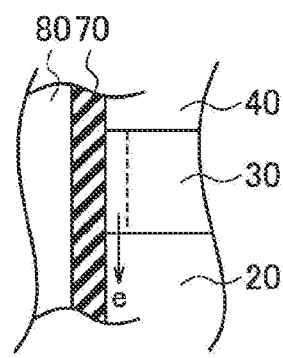
FIG. 10 is a diagram illustrating an example of migration of an electron in a channel region of the semiconductor device according to the modified example of the one or more embodiments.

Specifically, the base region 30 is formed to have the impurity concentration profile as illustrated in FIG. 9. Thus, it is possible to make the width of the channel region almost constant along the gate insulating film 70. As a consequence, electrons e migrate to the carrier accumulation layer 20 along the gate insulating film 70 as illustrated in FIG. 10.

Figure 11:
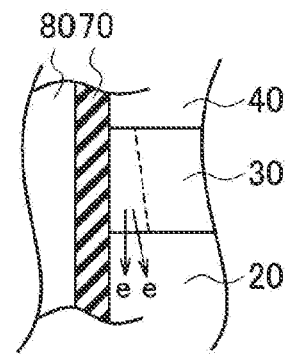
FIG. 11 is a diagram illustrating another example of migration of an electron in the channel region.

On the other hand, in the case of doping the surface of the drift region with the p-type impurity and annealing the surface as described in Patent Document 1, the impurity concentration of the base region 30 becomes lower in a region close to the carrier accumulation layer 20 as compared to a region closer to the emitter region 40. In this case, as illustrated in FIG. 11, the width of the channel region becomes larger in the region close to the carrier accumulation layer 20 whereby the electrons e also migrate in a region located away from the gate insulating film 70. Accordingly, since the amount of injection of electrons is increased at a lower portion of the base region 30, the semiconductor device requires only a short time from a flow of a short-circuit current to destruction of the semiconductor device, thus deteriorating the short circuit capacity thereof.

It is therefore possible to improve the short circuit capacity of the semiconductor device by setting the impurity concentration at the peak close to the carrier accumulation layer 20 higher than the impurity concentration at the peak closet the emitter region 40.

Other Embodiments

Although one or more embodiments have been described above, it is to be understood that the descriptions and drawings constituting part of this disclosure are not intended to limit the scope of this invention. Various alternative embodiments, examples, and operation techniques become apparent to a person skilled in the art from the teachings of this disclosure.

Figure 12:
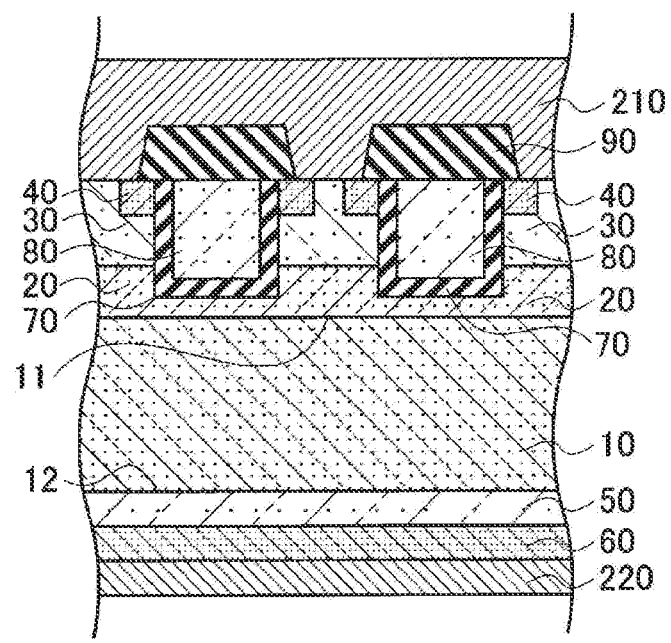
FIG. 12 is a diagram illustrating a schematic cross-sectional view of a semiconductor device according to one or more embodiments.

For example, the above-described embodiment discusses the case where the tip of the groove that penetrates the base region 30 and the carrier accumulation layer 20 reaches the drift region 10. However, such a groove does not always have to penetrate the carrier accumulation layer 20 as in a case illustrated in FIG. 12. In other words, the tip of the groove penetrating the base region 30 only needs to reach an upper part of the carrier accumulation layer 20.

Meanwhile, the carrier accumulation layer 20 may be formed by carrying out highly accelerated ion implantation into a deep position from the semiconductor surface and then performing an annealing process. This configuration reduces the chance of the impurity diffused in the carrier accumulation layer 20 and the impurity in the base region 30 annihilating with each other, thus suppressing the reduction in impurity concentration of the carrier accumulation layer 20 more appropriately.

Moreover, the above-described example discusses the case where the semiconductor device is of the n-channel type. However, the semiconductor device may be of the p-channel type instead.

As mentioned above, the present invention naturally includes various other embodiments which are not expressly discussed herein.

As described above, according to the semiconductor device and the method of manufacturing a semiconductor device according to the one or more embodiments, it is possible to provide the semiconductor device and the method of manufacturing a semiconductor device which are capable of suppressing the reduction in impurity concentration of the carrier accumulation layer in the manufacturing process.

The semiconductor device according to the present invention is applicable to the electronics industry including manufacturers that manufacture semiconductor devices provided with a carrier accumulation layer.

The invention claimed is:

1. A semiconductor device comprising:
a first semiconductor region of a first conductivity type;
a second semiconductor region of the first conductivity type with a higher impurity concentration than an impurity concentration of the first semiconductor region, the second semiconductor region being provided on a first principal surface of the first semiconductor region;
a third semiconductor region of a second conductivity type provided on an upper surface of the second semiconductor region, the third semiconductor region being doped with an impurity in accordance with an impurity concentration profile including peaks and convex regions along a film thickness direction;
a fourth semiconductor region of the first conductivity type provided on an upper surface of the third semiconductor region;
a gate insulating film provided on an inner wall of a groove that extends from an upper surface of the fourth semiconductor region and penetrates the third semiconductor region;
a control electrode provided inside the groove in such a way as to be opposed to a side surface of the third semiconductor region through the gate insulating film;
a fifth semiconductor region of the first conductivity type with a higher impurity concentration than the impurity concentration of the first semiconductor region, the fifth semiconductor region being provided on a second principal surface of the first semiconductor region opposed to the first principal surface; and
a sixth semiconductor region of the second conductivity type provided on the second principal surface of the first semiconductor region through the fifth semiconductor region, wherein
each of the convex regions is defined as an area of the impurity concentration profile from a first minimum value in the impurity concentration profile along the groove of the third semiconductor region to a next minimum value in the impurity concentration profile that sandwich one of the peaks, and
a width in a film thickness direction of each of the convex regions is smaller than a film thickness of the second semiconductor region along the groove.

2. The semiconductor device according to claim 1, wherein a film thickness of the third semiconductor region along the groove is larger than a film thickness of the second semiconductor region along the groove.

3. The semiconductor device according to claim 1, wherein an impurity concentration at the peak close to the second semiconductor region is higher than an impurity concentration at the peak close to the fourth semiconductor region in the impurity concentration profile along the groove of the third semiconductor region.

4. The semiconductor device according to claim 1, wherein a film thickness of the second semiconductor region along the groove is less than 1 μm.

* * * * *